United States Patent [19]

Miwa

[11] Patent Number: 4,745,372
[45] Date of Patent: May 17, 1988

[54] PHASE-LOCKED-LOOP CIRCUIT HAVING A CHARGE PUMP

[75] Inventor: Makoto Miwa, Tokyo, Japan

[73] Assignee: Matsushita Electric Industrial Co., Ltd., Osaka, Japan

[21] Appl. No.: 919,474

[22] Filed: Oct. 16, 1986

[30] Foreign Application Priority Data

Oct. 17, 1985 [JP] Japan .................. 60-231512
Oct. 3, 1986 [JP] Japan .................. 61-236464
Oct. 3, 1986 [JP] Japan .................. 61-236465
Oct. 3, 1986 [JP] Japan .................. 61-236466

[51] Int. Cl.[4] .................. H03L 7/10; H03L 7/18
[52] U.S. Cl. .................. 331/8; 331/14; 331/17; 331/25; 331/DIG. 2
[58] Field of Search .......... 331/8, 14, 17, 25, DIG. 2, 331/27; 328/133, 134

[56] References Cited

U.S. PATENT DOCUMENTS 3,599,110  8/1971  Gindi ................. 331/17 X
4,156,855  5/1979  Crowley .............. 331/17 X
4,167,711  9/1979  Smoot ................ 331/17
4,626,797 12/1986  Sakata ............... 331/17 X
4,649,353  3/1987  Sonnenberg .......... 331/25 X Primary Examiner—Siegfried H. Grimm
Attorney, Agent, or Firm—Stevens, Davis, Miller & Mosher

[57] ABSTRACT

A phase-locked-loop (PLL) circuit comprising a phase comparator, a current-variable charge pump, a voltage-controlled oscillator, a low-pass filter, and frequency dividers. The charge pump drive current is controlled in steps or continuously depending on the operating mode.

16 Claims, 10 Drawing Sheets

PHASE-LOCKED-LOOP CIRCUIT HAVING A CHARGE PUMP

BACKGROUND OF THE INVENTION

1. Field of the Invention

This invention relates to an improved phase-locked-loop (PLL) circuit for use in a frequency synthesizer or the like, and particularly to a PLL circuit in which the charge pump drive current is varied depending on the operating mode.

2. Description of the Prior Art

FIG. 1 shows the arrangement of a conventional 2-mode PLL circuit. In FIG. 1, reference number 1 denotes a reference oscillator having its output fed to a frequency divider 2, whose output is applied as a reference input to a phase comparator 3. The phase comparator 3 has a phase-lead output and a phase-lag output both supplied to a charge pump 4, and further has a phase lock signal 10 used as a control signal for a switch 5. The output of the charge pump 4 is fed to a low-pass filter 7, which has its characteristics changed by means of the switch 5. The low-pass filter 7 feeds its output to a voltage-controlled oscillator (VCO) 6, whose output is sent out as the output 9 of the PLL circuit and at the same time fed to a frequency divider 8. The output of the frequency divider 8 is applied to the other input of the phase comparator 3.

The operation of the above-described conventional PLL circuit is as follows. The circuit arrangement of FIG. 1, except for the presence of the switch 5, is a commonly used phase lock loop circuit which operates for an oscillation frequency $f_R$ of the reference oscillator 1, a division ratio M of the frequency divider 2 and a division ratio N of the frequency divider 8 to produce an output 9 at a frequency fo given as follows.

$$fo = \frac{N}{M} f_R$$

The output frequency fo can be variable through the provision of frequency dividers 2 and 8 having variable frequency division ratios M and N. The characteristics of the loop are expressed in terms of the loop gain and the transfer characteristics of the low-pass filter 7, and when an RC filter shown in FIG. 1 is used as the low-pass filter 7, this loop becomes a second-order loop.

For a supply voltage Vp of the charge pump and a modulation sensitivity Kv of the VCO, the natural frequency ($\omega n$) and damping factor ($\zeta$) which determine the PLL response are given as follows.

$$\omega n \simeq \sqrt{\frac{Kv \cdot \frac{Vp}{(r_1 + r_2 + r_3) \times 2}}{2\pi CN}}$$

$$\zeta \simeq \frac{r_2 + r_3}{2} \sqrt{\frac{Kv \cdot \frac{Vp}{2(r_1 + r_2 + r_3)} \cdot C}{2\pi N}}$$

Accordingly, by closing the switch 5 to short the resistor $r_2$, the value of $\omega n$ increases, the natural frequency of PLL rises, and the system has a faster response. Therefore, when the PLL is in a non-locked mode, it can be pulled into synchronization much faster by appling the phase lock signal 10 to close the switch 5. In a locked mode, the switch 5 is made open with a result of a smaller $\omega n$, and the circuit is advantageous in noise suppression and stability. Accordingly, by switching the filter characteristics, the PLL circuit can have consistent characteristics of fast response and high noise immunity.

However, the above conventional 2-mode PLL circuit employs a switch for changing the filter transfer characteristics depending on the operating mode, and it must be an external switch when the circuit is fabricated as an integrated circuit module, which hampers the circuit miniaturization. In addition, the mode switch is apt to disturb the operation of the voltage-controlled oscillator.

SUMMARY OF THE INVENTION

An object of this invention is to provide a PLL circuit which is suitable for miniaturization, particularly when fabricating as an integrated circuit module.

Another object of this invention is to provide a PLL circuit which is quickly responsive by changing the operating mode to meet the phase lock condition of the PLL circuit.

A further object of this invention is to provide a PLL circuit having a voltage-controlled oscillator which is insusceptible to the switching of the operating mode.

Still another object of this invention is to provide a PLL circuit which is sharply responsive to the channel switching or the like so as to prevent the occurrence of out-locking when used in a synthesizer or the like.

In order to achieve the above objectives, the inventive PLL circuit is intended to vary the drive current of the charge pump so that the operating mode is changed continuously or in multiple discrete steps. The operating mode is switched by changing the charge pump drive current so as to change the loop gain, instead of switching the filter parameter, and therefore the system is more resistive against disturbance and the drive current switching circuit is more suitable for the fabrication in an integrated circuit module.

DESCRIPTION OF THE PREFERRED EMBODIMENT

Figure 2:
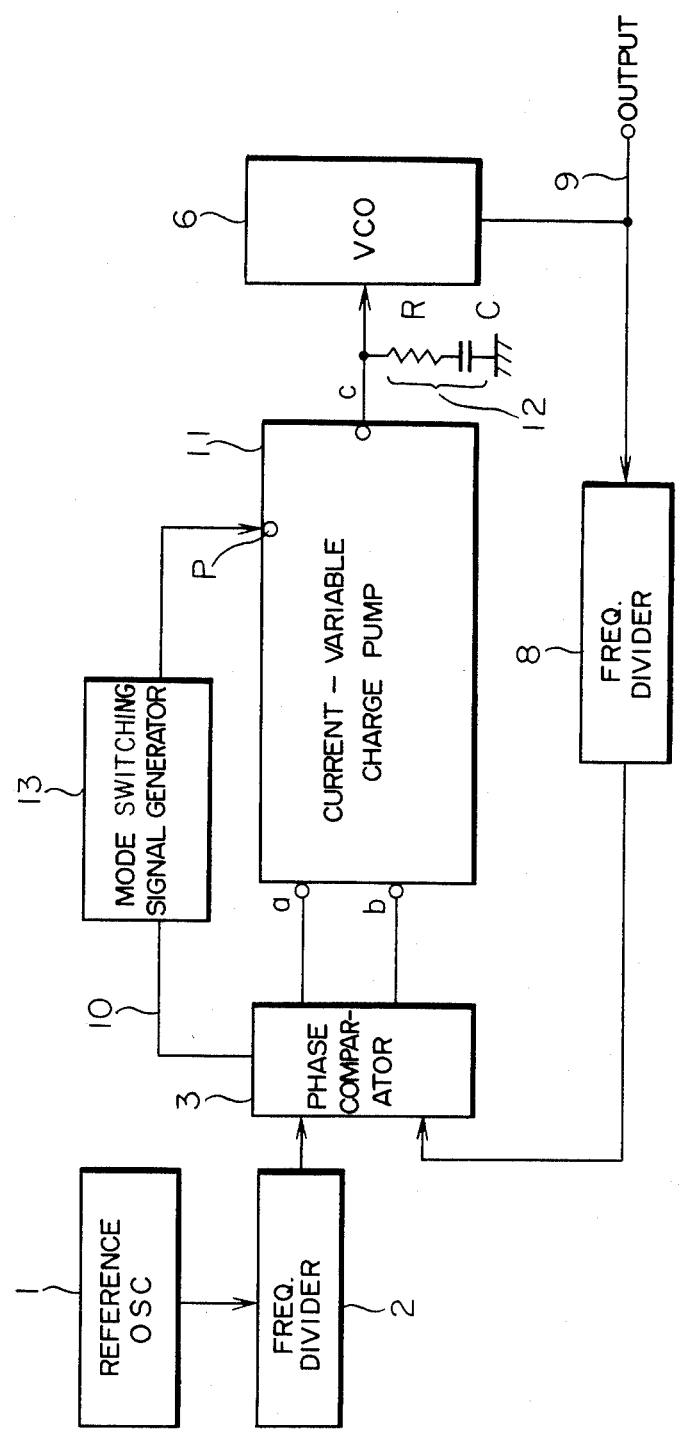
FIG. 2 is a block diagram showing the basic arrangement of the inventive PLL circuit.

FIG. 2 shows the basic arrangement of this invention, in which a reference oscillator 1 has its output received by a frequency divider 2, whose output is applied as a reference input to a phase comparator 3. The phase comparator 3 has a phase-lag output a and a phase-lead output b both received by a current-variable charge pump 11, which has an output c fed through a filter 12 to a voltage-controlled oscillator 6. The output of the voltage-controlled oscillator 6 is sent out as the output 9 of the PLL circuit and at the same time applied to another frequency divider 8, whose output is applied to the other input of the phase comparator 3. Reference number 10 denotes a phase lock signal produced by the phase comparator 3, and it is processed in a mode switching signal generating circuit 13 and applied as a switching signal to the drive current control terminal P of the current-variable charge pump 11.

Figure 5:
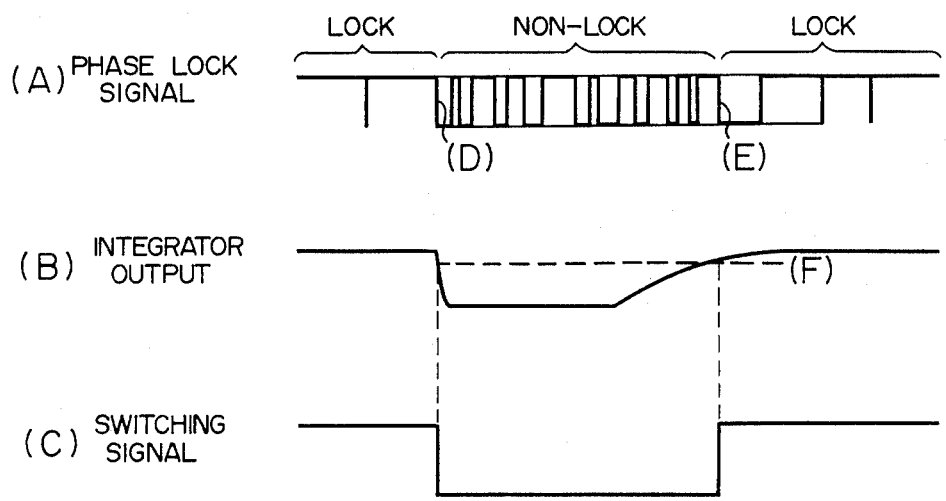
FIG. 5 is a waveform diagram used to explain the operation of the circuit shown in FIG. 4.

Next, the operation of the above circuit arrangement will be described. The basic operation as a PLL circuit is identical to the aforementioned conventional arrangement, and the PLL having a 2-order loop produces a frequency which is determined from the division ratios of the frequency dividers 2 and 8. The current-variable charge pump 11 differs from the conventional constant drive current charge pump in that the phase lock signal 10 from the phase comparator 3 (see FIG. 5(A)) is fed to the mode switching signal generating circuit 13 to produce a switching signal and it is received at the drive current control terminal P, so that the drive current is controlled to match the value of the mode switching signal. The following describes the mode control in connection with FIG. 3 by taking an example of a 2-mode PLL circuit operative in two modes.

Figure 3:
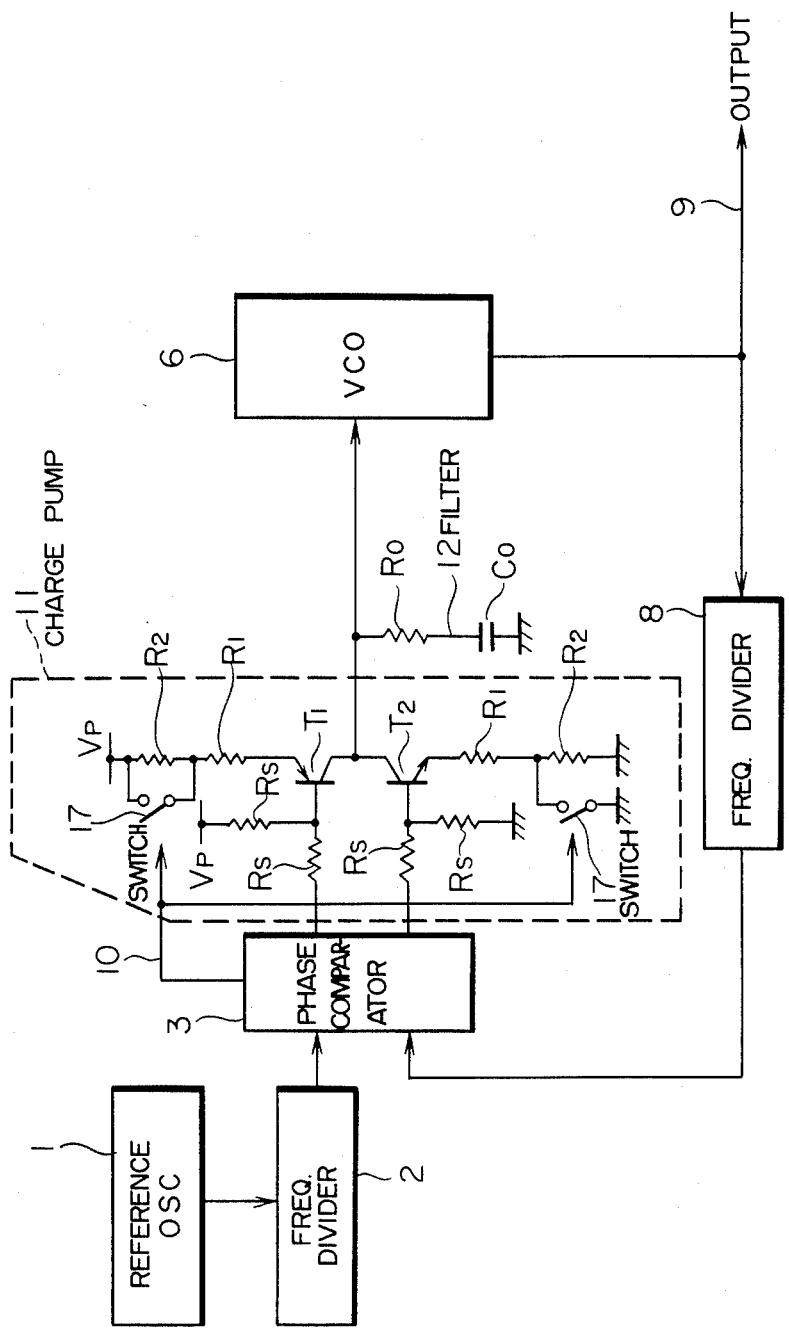
FIG. 3 is a schematic diagram of the inventive 2-mode PLL circuit.

In FIG. 3, the charge pump 11 includes a pair of pnp and npn transistors T1 and T2 each having resistors Rs connected between the base and the phase comparator 3 and between the base and the ground. Among two resistors R1 and R2 connected in series to the emitter of each transistor, the resistor R2 is shunted by a switch 17 which operates by being controlled by the phase lock signal 10. The switch 17 is typically an analog switch for the convenience of fabrication in an integrated circuit module. This PLL circuit operates identically to the conventional arrangement, although both PLL systems of 2-order loop differ in the arrangement of the charge pump 11 and the location of the switches 17, and produces a frequency which is determined from the division ratios of the frequency dividers 2 and 8.

With the switches 17 being kept open, the PLL system has the loop characteristics given as follows:

$$\omega_{na} \simeq \sqrt{\frac{K_v \cdot \dfrac{V_P - 2V_{BE}}{2(R_1 + R_2)}}{2\pi CN}}$$

-continued $$\zeta_a \simeq \frac{R_0}{2} \sqrt{\frac{K_v \cdot \dfrac{V_P - 2V_{BE}}{2(R_1 + R_2)} C}{2\pi N}}$$

where $V_{BE}$ is the base-to-emitter voltage of the transistors.

The drive current of the charge pump is $$\frac{V_P - 2V_{BE}}{2(R_1 + R_2)}$$

With the switches 17 being closed, the loop characteristics are given as follows:

$$\omega_{nb} \simeq \sqrt{\frac{K_v \cdot \dfrac{V_P - 2V_{BE}}{2R_1}}{2\pi CN}}$$

$$\zeta_b \simeq \frac{R_0}{2} \sqrt{\frac{K_v \cdot \dfrac{V_P - 2V_{BE}}{2R_1} C}{2\pi N}}$$

The drive current of the charge pump is $$\frac{V_P - 2V_{BE}}{2R_1}.$$

From the above two cases of static operations, it will be appreciated that the drive current of the charge pump varies in response to the operation of the switches 17, and eventually the response of the system varies. Accordingly, by driving the switches 17 using the phase lock signal 10, there is realized a 2-mode PLL having a smaller $\omega n$ and thus a narrow noise band in a synchronized state and having a larger $\omega n$ and thus a fast response speed in a pull-in transition. Actual measurement of the synchronization time for the above circuit arrangement proved a speed-up of 30% or more from 37 ms of the conventional PLL circuit to 25 ms or less according to this invention.

Figure 4:
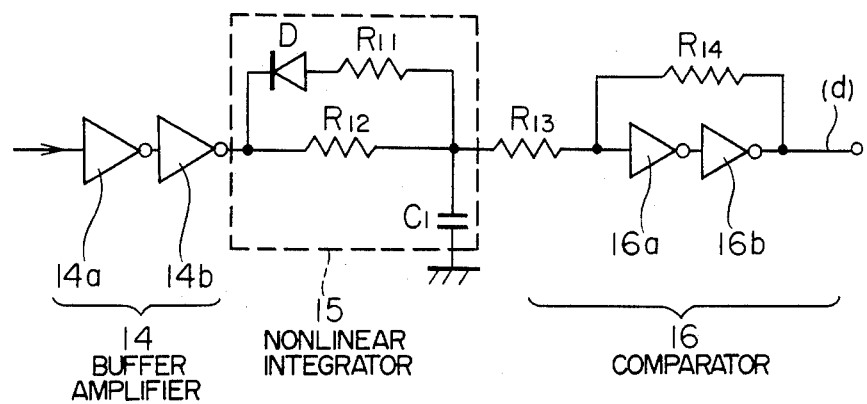
FIG. 4 is a schematic diagram showing a specific arrangement of the mode switching signal generating circuit.

FIG. 4 shows a specific arrangement of the mode switching signal generating circuit 13, which consists of a serial connection of a buffer amplifier stage 14, a nonlinear integrator 15 and a comparator stage 16. The buffer amplifier stage 14 is made up of two series-connected amplifiers 14a and 14b, and it receives the phase lock signal. The nonlinear integrator 15 is made up of a diode D, resistors R11 and R12 (R12>R11) and a capacitor C1. The comparator stage 16 is made up of amplifiers 16a and 16b and resistors R13 and R14, and it produces a switching signal d. In operation, as shown in the waveform diagram of FIG. 5, the phase lock signal (A) is received by the buffer amplifier 14, and in the transition from a locked mode to an out-lock mode such as the case of channel switching, which yields a negative pulse, the diode D becomes conductive to quickly discharge the integrator 15 in a small time-constant determined by the resistor R11 and capacitor C1 as shown by the waveform (B) so as to provide promptly the switching signal to meet the non-lock mode, while in the transition from a non-lock mode to a locked mode, in which the generation of the negative pulse ceases as shown by (E), the diode D becomes non-conductive and the switching signal (C) is produced with a large time-constant determined by the resistor R12 and capacitor C1, allowing the confirmation of perfect locking. The transition of the switching signal (C) is caused by the threshold level (F) of the comparator 16.

The mode switching signal generating circuit 13 for 2-mode switching can be expanded for use in switching three modes or more through the parallel connection of comparators, each producing a switching signal, for slicing the output of the nonlinear integrator 15 at the number of threshold levels (smaller by one than the number of modes).

Figure 6:
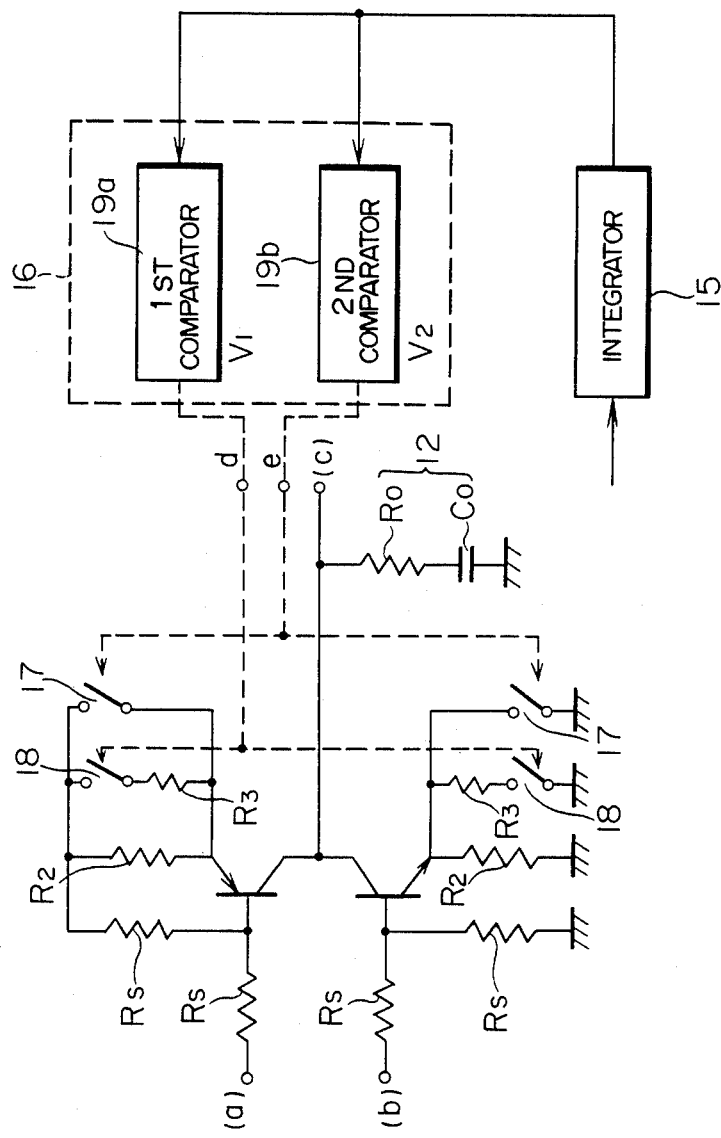
FIG. 6 is a schematic diagram of the charge pump in the 3-mode PLL circuit.

FIG. 6 shows as an example the arrangement of the charge pump used in the 3-mode PLL circuit, and it is basically the same as the arrangement of FIG. 3. The arrangement includes a first switch 18 in serial connection with a resistor R3, and they are connected in parallel to the switch 17 (second switch) and also in parallel to a resistor R2. First and second comparators 19a and 19b have individual preset threshold levels V1 and V2. In the 3-mode operation of the above arrangement, the first and second switches 17 and 18 are open so that the resistor R2 is active when the integrator 15 (e.g., a nonlinear integrator) has its output higher than a certain value V1, the first switch 18 is closed by the output of the first comparator 19a so that the resistor R2 and R3 are in parallel connection when the integrator output is between V1 and V2, and the second switch 17 is closed by the output of the second comparator 19b so that R2 is shorted when the integrator output is lower than V2.

Figure 7:
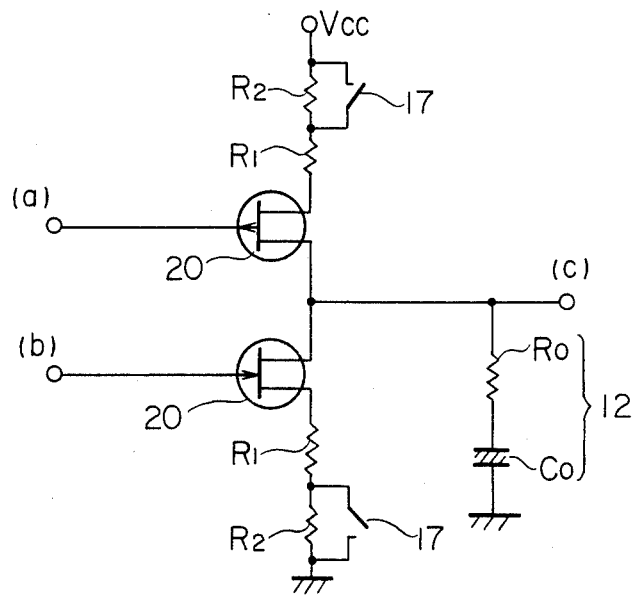
FIG. 7 is a schematic diagram of the charge pump arranged by employment of FETs.

FIG. 7 shows another arrangement of the charge pump, which employs junction field effect transistors (FETs) in place of the bipolar switching transistors in the arrangements of FIG. 3 and FIG. 6. Besides the junction FETs, other types of FETs such as MOS FETs and dual-gate MOS FETs can also be used. The arrangement of FIG. 7 includes junction FETs 20, resistors R1 and R2 and a switch 17. The basic operation is identical to the 2-mode operation as in the arrangement shown in FIG. 3, but it has the advantage of a simpler circuit configuration as compared with the cases of using bipolar transistors.

Figure 8:
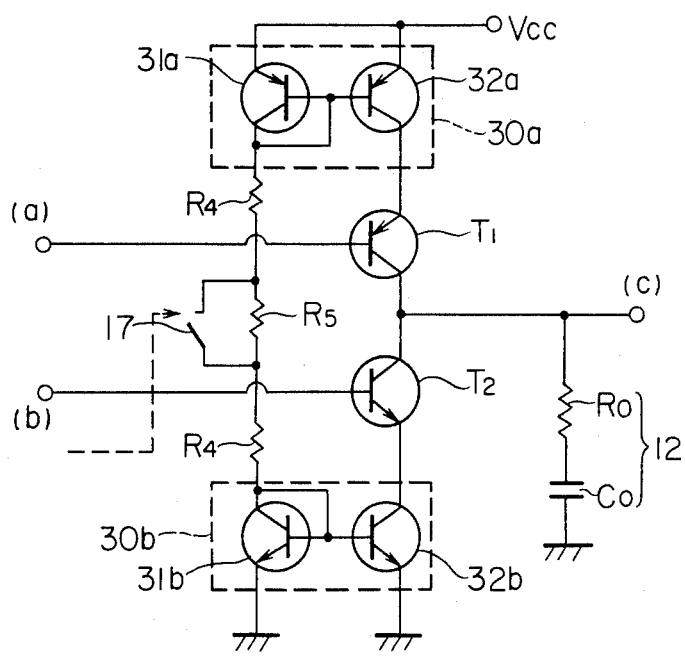
FIG. 8 is a schematic diagram of the charge pump in the 2-mode PLL circuit employing current mirror circuits.
Figure 9:
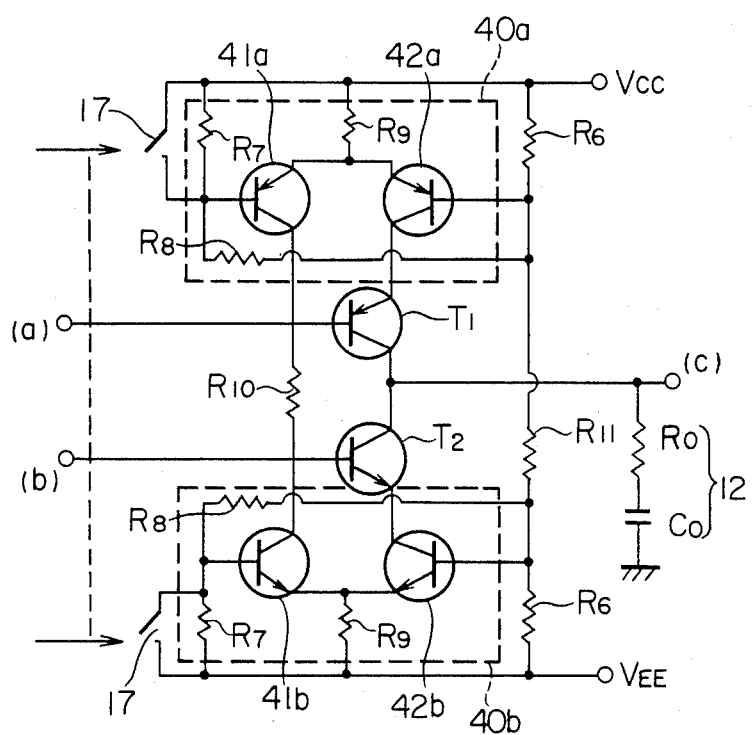
FIG. 9 is a schematic diagram of the charge pump in the 2-mode PLL circuit employing differential amplifiers.

FIGS. 8 and 9 show other arrangements of the charge pump, in which constant current sources are connected in series to the transistors T1 and T2. As the constant current source, a current mirror circuit is used in FIG. 8, while a differential amplifier is used in FIG. 9. The arrangement of FIG. 8 has a current mirror circuit 30a configured by pnp transistors 31a and 32a having their bases connected, with the collector of 31a connected to a resistor R4, and another current mirror circuit 30b configured in the same fashion by npn transistors 31b and 32b. Both circuits provide a constant current through the collectors of the transistors 32a and 32b by setting the collector current of the transistors 31a and 31b using a resistor R4. A resistor R5 shunted by the switch 17 is inserted in the serial connection of the two resistors R4, so that the collector current of the transistors 31a and 31b is changed by opening or closing the switch 17 in accordance with the lock mode.

The arrangement of FIG. 9 employs a differential amplifier 40a made up of pnp transistors 41a and 42a and another differential amplifier 40b made up of npn transistors 41b and 42b with the provision of transistor bias setting resistors R7–R11. By opening or closing the switch 17 connected across the resistor R7, the charge pump drive current can be switched in response to the lock mode, as in the case of FIG. 8. In the above arrangements, the transistor output current is controlled accurately using the constant current sources, and they are advantageous in high-accuracy performance when the whole charge pump is fabricated in an integrated circuit package.

The foregoing embodiments are all multi-mode PLL circuits in which the charge pump drive current is varied in multiple steps depending on the operating mode. The following will describe another embodiment of the PLL circuit in which the charge pump drive current is varied continuously.

Figure 10:
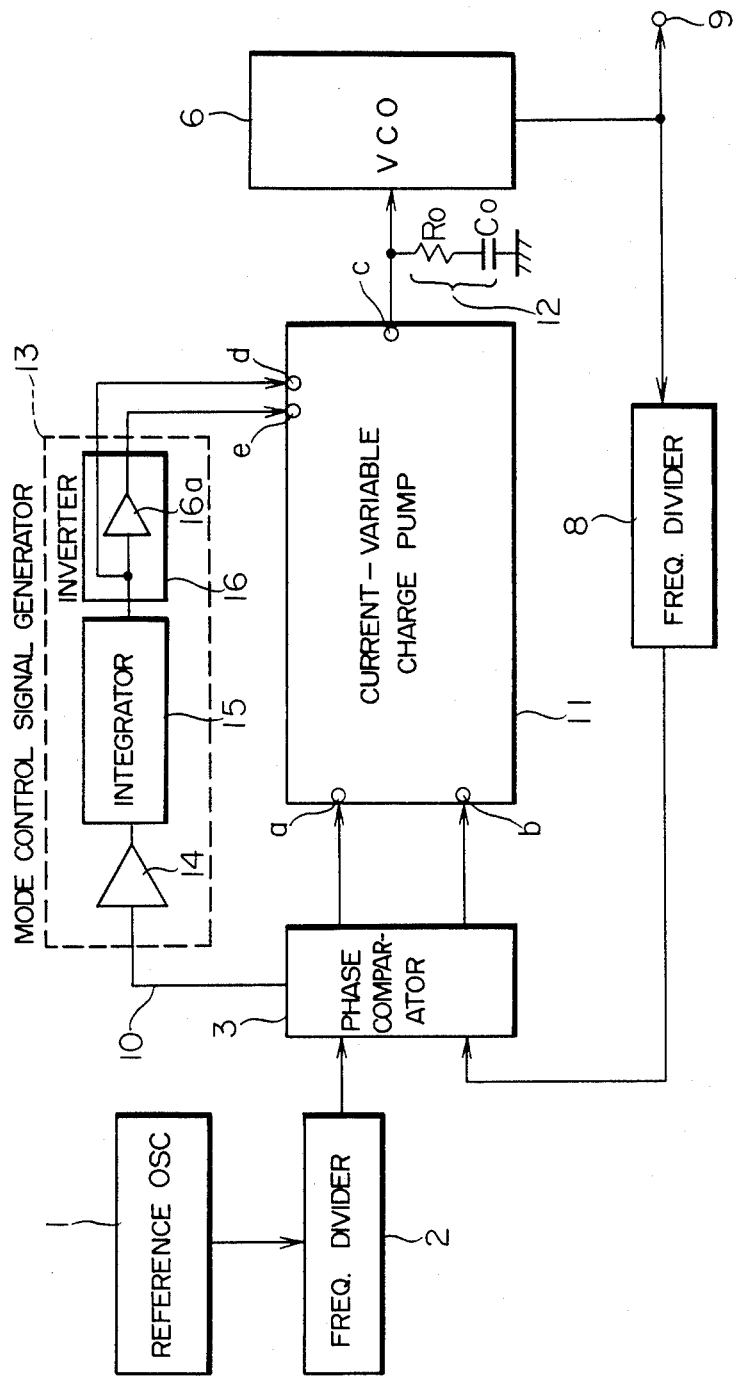
FIG. 10 is a block diagram showing the basic arrangement of the continuous variable-mode PLL circuit.

In FIG. 10, a reference oscillator 1 has its output fed to a frequency divider 2, the output of which is applied as a reference input to a phase comparator 3. The phase comparator 3 provides a phase-lag output (a) and a phase-lead output (b) for a current-variable charge pump 11, which hs its output fed through a filter 12 and received by a voltage-controlled oscillator 6. The output of the voltage-controlled oscillator 6 is sent out as the output 9 of the PLL circuit and at the same time applied to another frequency divider 8, the output of which is received at the other input of the phase comparator 3.

A pair of control signals (d) and (e) for controlling the current-variable charge pump 11 are produced as outputs of a mode control signal generating circuit 13 which consists of a buffer amplifier 14, an integrator 15 and a polarity inverter stage 16, all in a serial connection dealing with the phase lock signal 10 from the phase comparator 3. The integrator 15 may be a simple resistor-capacitor configuration, or may be a highly sophisticated integration circuit. The polarity inverting amplifier 16 receives the output of the integrator 15 and sends it out directly as a non-inverting output (d) and reverses the polarity of the input by an inverter 16a to produce an inverted output (e).

Next, the operation of this embodiment will be described. The basic operation as a PLL circuit is identical to the case of the conventional arrangement. The phase lock signal 10 produced by the phase comparator 3 is a pulse signal having its pulse width varied depending on the lock mode of the PLL circuit. The signal is fed through the buffer amplifier 14 to the integrator 15, which has its output inverted by the polarity inverter stage 16 to produce a pair of non-inverted output (d) and inverted output (e). These signals are applied as a control input to the current-variable charge pump 11 so as to vary continuously the drive current of the charge pump 11 thereby to vary the loop characteristics of PLL depending on the lock mode.

Figure 11:
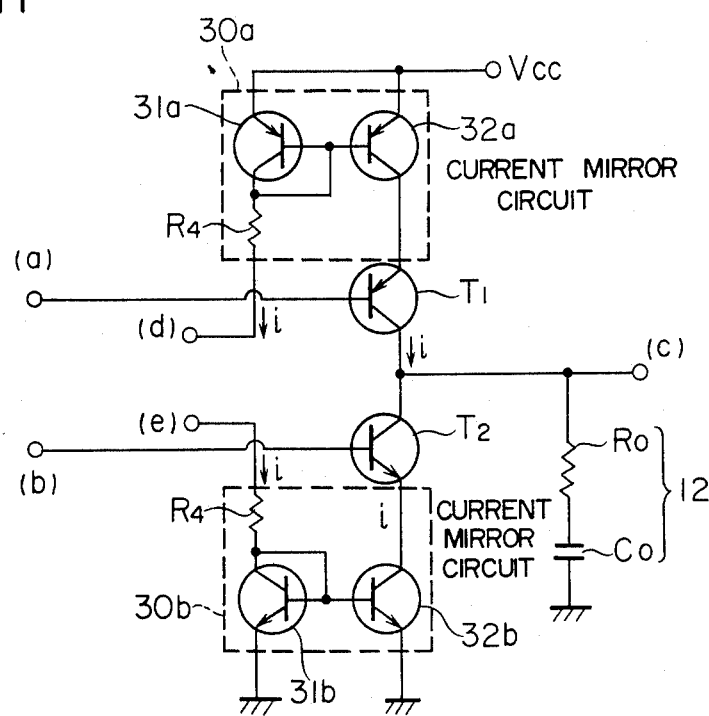
FIG. 11 is a schematic diagram of the charge pump in FIG. 10 employing current mirror circuits.

FIG. 11 shows a specific arrangement of the current-variable charge pump 11, which includes a current mirror circuit 30a made up of pnp transistors 31a and 32a and a resistor R4 and another current mirror circuit 30b made up of npn transistors 31b and 32b and a resistor R4, both circuits constituting a pair of constant current sources. In the current mirror circuit 30a, the transistor 32a conducts a current i equal in magnitude to that flowing out of the terminal d. The current mirror circuit 30b operates in the same way as 30a. Accordingly, the charge pump 11 receives at the terminals (a) and (b) the phase-lag and phase-lead signals from the phase comparator 3, and produces an output (c) depending on the magnitude of the drive current from the mode control signal generating circuit 13.

Figure 12:
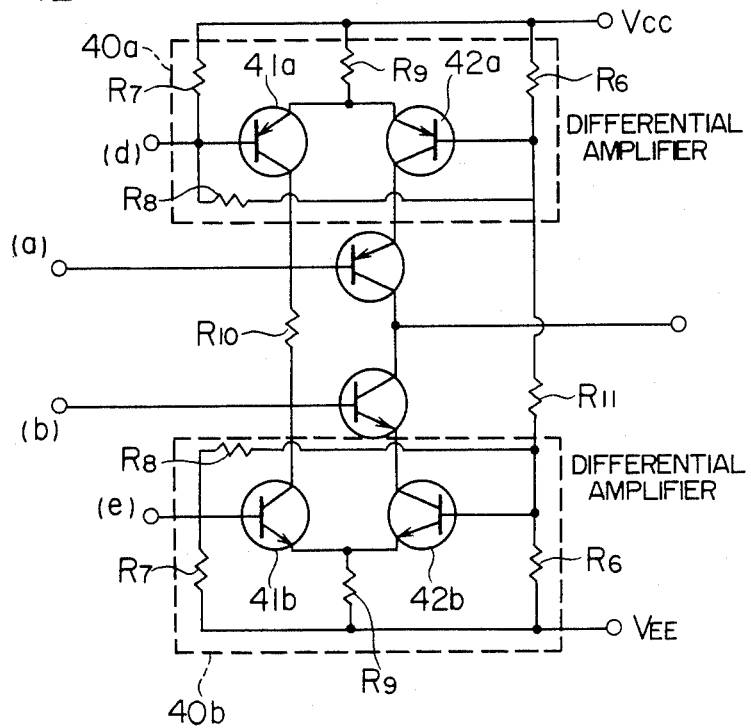
FIG. 12 is a schematic diagram of the charge pump in FIG. 10 employing differential amplifiers.

FIG. 12 shows a further arrangement of the charge pump employing a pair of differential amplifiers which serve as constant current sources. One differential amplifier 40a consists of two pnp transistors 41a and 42a and bias setting resistors R6–R9, while another differential amplifier 40b consists of two npn transistors 41b and 42b and bias setting resistors R6–R9, and both amplifiers are connected by resistors R10 and R11. In operation, the differential amplifiers 40a and 40b receive at the bases of the transistors 41a and 41b the outputs (d) and (e) of the mode control signal generating circuit 13, and produce on the transistors 42a and 42b the output current which can be controlled continuously.

According to this embodiment, as described above, the phase lock signal 10 from the phase comparator 3 is applied via the integrator 15 to the current control terminal of the current-variable charge pump which is driven by the constant current sources, so that the loop gain is varied continuously by changing the drive current continuously in response to the synchronization condition of the PLL circuit, whereby the circuit is advantageous in the accuracy of operation as compared with the drive current multiple switching system based on the linear approximation.

Figure 1:
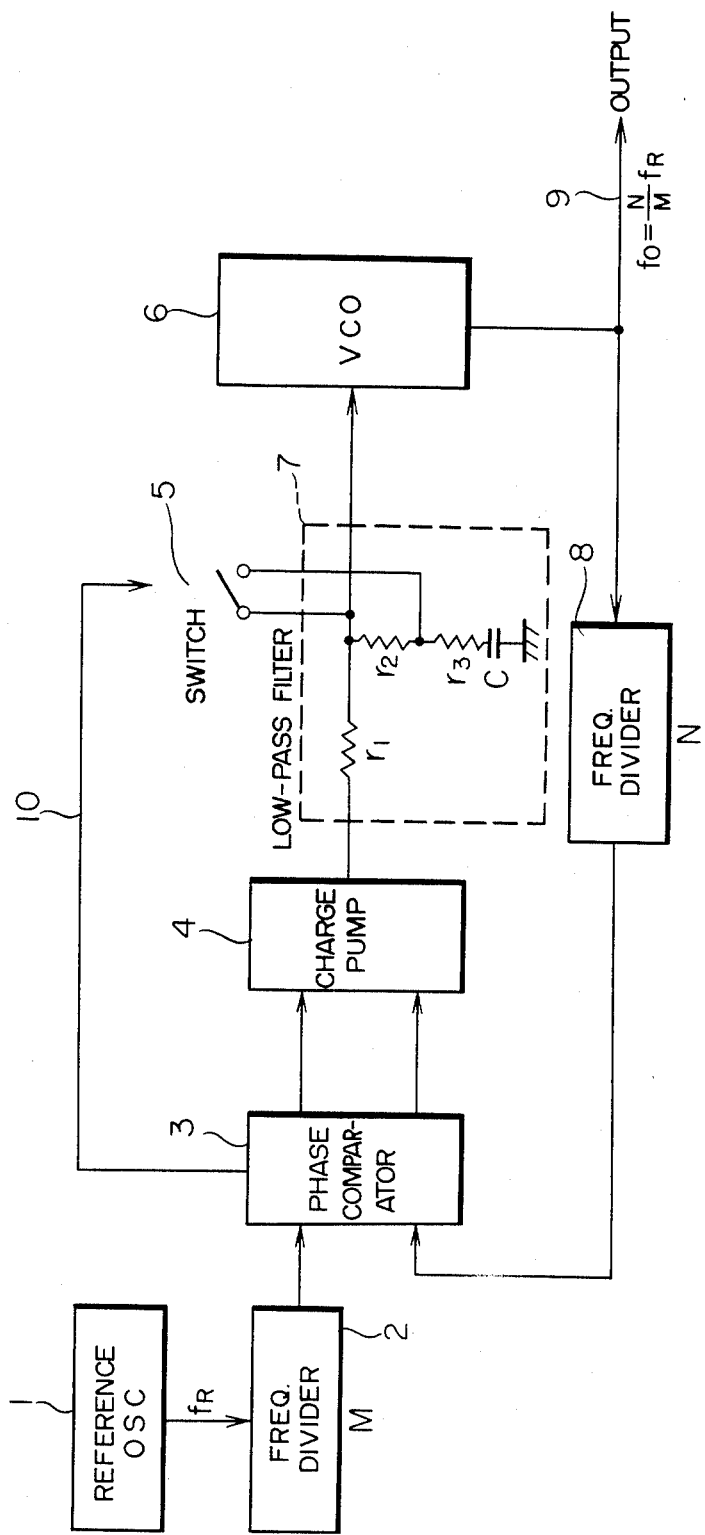
FIG. 1 is a block diagram of the conventional PLL circuit.
Figure 13:
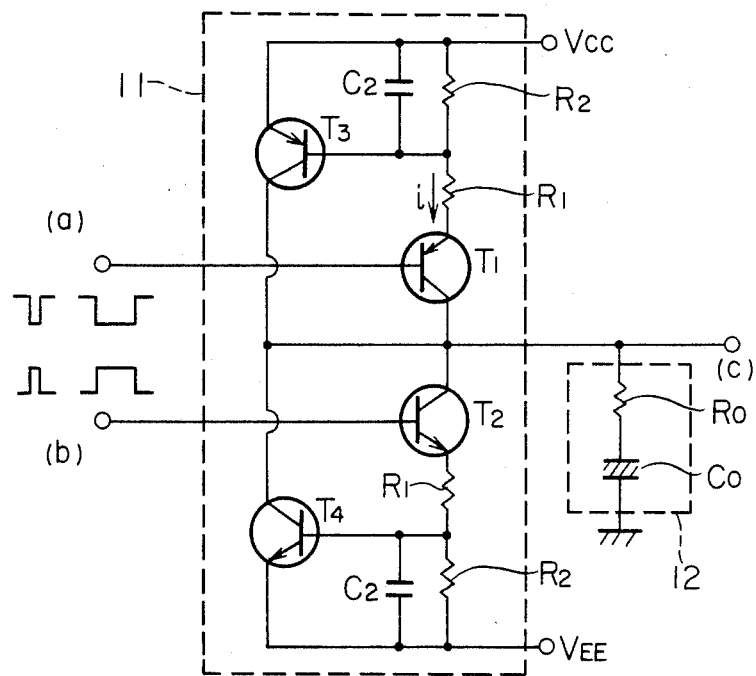
FIG. 13 is a schematic diagram of the charge pump in the automatic mode switching PLL circuit.

FIG. 13 shows the arrangement of the charge pump in which the outputs (a) and (b) of the phase comparator 3 are used directly for mode switching, instead of using the mode switching signal generating circuit 13 in FIG. 2. In the figure, the charge pump 11 consists of pnp switching transistors T1 and T3, npn switching transistors T2 and T4, resistors R1 and R2, a capacitor C2, input terminals (a) and (b) for receiving phase difference pulses in negative and positive polarities, respectively, from the phase comparator 3, and an output terminal (c) for sending out output pulses to the VCO 6. The circuit operates on $V_{CC}$ and $V_{EE}$. A negative pulse at the input terminal (a) activates a circuit section including the switching transistors T1 and T3, resistors R1 and R2 and capacitor C2. The input terminal (a) is connected to the base of the switching transistor T1, which has its emitter connected through serial resistors R1 and R2 to the power supply $V_{CC}$. The node of the resistors R1 and R2 is connected to the base of the switching transistor T3, and the resistor R2 is shunted by the capacitor and also in parallel by the base and emitter of the switching transistor T3. In the same fashion, the input terminal (b) for positive pulses is connected to a circuit section including the switching transistors T2 and T4, resistors R1 and R2 and capacitor C2. The switching transistors T1–T4 have their collectors connected together to provide an output to the output terminal (c), on which line a low-pass filter 12 made up of a resistor R0 and capacitor C0 in series is connected to the ground. Other components referred to by the same symbols as used in FIG. 1 are the same components as in FIG. 1.

Next, the operation of this embodiment will be described. The phase comparator 3 compares the frequency of the VCO 6 with the frequency of the reference oscillator 1 at the outputs of the variable-ratio frequency divider 8 and fixed-ratio frequency divider 2, and produces a negative pulse when a phase lag is detected for the VCO output, or produces a positive pulse when a phase lead is detected for the VCO output. In any case, a greater phase difference results in a wider pulse width. If the phase comparator 3 provides no output pulses to the input terminals (a) and (b), no current flows in the transistors T1–T4, and the output terminal (c) is kept at the charged voltage of the capacitor C0. If a negative pulse is applied to the input terminal (a) due to a phase lag, the switching transistor T1 becomes conductive during the active period of the pulse, causin the output terminal (c) to charge the capacitor C0 in the low-pass filter 12 to a positive voltage. At the same time, the emitter current i of the switching transistor T1 creates a voltage drop across the resistor R2, and the capacitor C2 is charged to the differential voltage. The base voltage of the switching transistor T3 falls deeply in proportion to the width of the negative pulse applied to the input terminal (a), and when it falls below a certain value the switching transistor T3 becomes conductive. The output current of the switching transistor T3 in the conductive state is added to the output current at the output terminal (c). Since the switching transistor T3 has a sufficiently large current capacity, a greater phase lag results in a higher rising rate of the voltage at the output terminal (c). Similar operation takes place when a positive pulse is received at the input terminal (b).

According to this embodiment, the drive current of the charge pump 11 is controlled automatically in response to the value of the phase difference. The above embodiment is arranged such that the charge pump drive current is controlled automatically using a charge pump including first and second switching transistors and a time-constant circuit, and this allows the construction of an automatic mode-switching PLL circuit without using any switch. As a result, this embodiment is advantageous in providing a PLL system which has a variable response with a relatively simple circuit arrangement which is suitable for being fabricated as an integrated circuit module.

Although in the above description of the various embodiments the mode switching signal generating circuit 13 and the like are shown and described as independent blocks, it is also possible to design the phase comparator 3 to incorporate the integrator 15.

I claim:
1. A phase-locked loop (PLL) circuit comprising:
   a first frequency divider,
   a second frequency divider,
   a digital phase comparator having a reference input terminal to which an output of said first frequency divider is applied and another input terminal to which an output of said second frequency divider is applied and producing two phase difference outputs and a phase lock output,
   a charge pump responsive to the phase difference outputs of said digital phase comparator and producing a drive current which is variable depending on the phase lock output of said phase comparator, and
   a voltage-controlled oscillator driven by the output of said charge pump,
   said charge pump including (i) a pair of switching circuits each having a control terminal receiving one of the phase difference outputs of said phase comparator and a common output terminal providing the drive current to said voltage-controlled oscillator and (ii) drive current control means responsive to the phase lock output of said phase comparator and connected to each of said switching circuits.
2. A PLL circuit according to claim 1, wherein said drive current control means comprises a time-constant circuit connected in series with said switching circuits and a second switching circuit having an input terminal connected to said time-constant circuit and an output terminal connected to said common output terminal of said switching circuits, said second switching circuit having a control terminal receiving the phase lock output of said phase comparator and operating to charge and discharge said time-constant circuit, thereby operating said second switching circuit.

3. A PLL circuit according to claim 1, wherein said pair of switching circuits comprises a pair of npn and pnp transistors having their collectors connected together, phase difference outputs of said phase comparator being connected to the bases of said npn and pnp transistors.

4. A PLL circuit according to claim 1, wherein said pair of switching circuits comprises field effect transistors (FETs) having their drains connected together, phase difference outputs of said phase comparator being connected to the gates of said FETs.

5. A PLL circuit according to claim 1, wherein said drive current control means comprises a resistor means and a mode switching signal generating circuit for producing a mode switching signal which changes by means of a switch means the value of said resistor means in steps equal in number to the number of PLL modes in response to said phase lock output provided by said phase comparator.

6. A PLL circuit according to claim 1, wherein said drive current control means comprises a constant current source having a constant current control terminal connected with a resistor means, the value of said resistor means being switched in response to the output of a mode switching signal generating circuit which produces mode signals for switching by means of a switch means the value of said resistor means in steps equal in number to the number of PLL modes in response to said phase lock output provided by said phase comparator.

7. A PLL circuit according to claim 1, wherein said drive current control means comprises a constant current source having a constant current control terminal, said terminal receiving the output of a continuous mode-switching signal generating circuit which operates in response to said phase lock output from said phase comparator so that said mode is varied continuously.

8. A PLL circuit according to claim 6, wherein said constant current source comprises a current mirror circuit including a pair of transistors with bases thereof being connected together, one of said transistors providing the output of said constant current source, while the other transistor provides the output to said constant current control terminal.

9. A PLL circuit according to claim 7, wherein said constant current source comprises a current mirror circuit including a pair of transistors with bases thereof being connected together, one of said transistors providing the output of said constant current source, while the other transistor provides the output to said constant current control terminal.

10. A PLL circuit according to claim 6, wherein said constant current source comprises a differential amplifier, one input terminal of said amplifier being said constant current control terminal.

11. A PLL circuit according to claim 7, wherein said constant current source comprises a differential amplifier, one input terminal of said amplifier being said constant current control terminal.

12. A PLL circuit according to claim 5, wherein said mode switching signal generating circuit comprises an integrator and at least one following comparator, said integrator receiving the phase lock output from said phase comparator, said at least one comparator slicing the output level of said integrator at threshold levels corresponding in number to the number of modes.

13. A PLL circuit according to claim 5, wherein said switch means comprises analog switches corresponding in number to the number of modes.

14. A PLL circuit according to claim 7, wherein said continuous mode-switching signal generating circuit comprises an integrator which receives the phase lock signal and a polarity inverting circuit following said integrator.

15. A PLL circuit according to claim 12, wherein said integrator comprises a diode and operates to integrate the phase lock output at different speeds for a rising slope and a falling slope of the signal.

16. A PLL circuit according to claim 14, wherein said integator comprises a diode and operates to integrate the phase lock output at different speeds for a rising slope and a falling slope of the signal.

* * * * *